US009368203B1

(12) United States Patent
Huang et al.

(10) Patent No.: US 9,368,203 B1
(45) Date of Patent: Jun. 14, 2016

(54) MEMORY DEVICE AND DRIVING METHOD THEREOF

(71) Applicants: Ningbo Advanced Memory Technology Corporation, Ningbo (CN); Being Advanced Memory Taiwan Limited, Hsinchu County (TW)

(72) Inventors: Sheng-Tsai Huang, Hsinchu County (TW); Jia-Hwang Chang, Hsinchu County (TW); Jui-Jen Wu, Hsinchu County (TW)

(73) Assignees: Ningbo Advanced Memory Technology Corporation, Ningbo (CN); Being Advanced Memory Taiwan Limited, Hsinchu County (TW)

( * ) Notice: Subject to any disclaimer, the term of this patent is extended or adjusted under 35 U.S.C. 154(b) by 0 days.

(21) Appl. No.: 14/864,897

(22) Filed: Sep. 25, 2015

(30) Foreign Application Priority Data

May 22, 2015 (CN) .......................... 2015 1 0266961

(51) Int. Cl.
*G11C 11/00* (2006.01)
*G11C 13/00* (2006.01)

(52) U.S. Cl.
CPC .......... *G11C 13/004* (2013.01); *G11C 13/0004* (2013.01); *G11C 13/0007* (2013.01); *G11C 13/0069* (2013.01); *G11C 2013/0085* (2013.01)

(58) Field of Classification Search
CPC ............. G11C 13/004; G11C 13/0004; G11C 13/0007; G11C 13/0069
USPC .................................................. 365/148, 100
See application file for complete search history.

(56) References Cited

U.S. PATENT DOCUMENTS

| 6,462,984 | B1 | 10/2002 | Xu et al. |
| 6,912,146 | B2 | 6/2005 | Gill et al. |
| 7,245,526 | B2 | 7/2007 | Oh et al. |
| 8,018,763 | B2 | 9/2011 | Fackenthal et al. |
| 8,064,248 | B2 | 11/2011 | Lung |
| 8,139,404 | B2 * | 3/2012 | Tsukada ............... G11C 7/1006 365/163 |
| 8,730,734 | B2 * | 5/2014 | Nguyen ................... G11C 8/08 365/185.13 |
| 8,817,515 | B2 * | 8/2014 | Kouno ................... G11C 5/063 365/148 |
| 8,971,133 | B1 * | 3/2015 | Zheng ....................... G11C 7/12 365/185.25 |
| 9,087,582 | B2 * | 7/2015 | Ninomiya .......... G11C 13/0069 |
| 9,324,426 | B2 * | 4/2016 | Jang ..................... G11C 13/004 |
| 2005/0219914 | A1 | 10/2005 | Sarin et al. |
| 2006/0126424 | A1 | 6/2006 | Ogiwara |

FOREIGN PATENT DOCUMENTS

EP          1326254 B1    2/2009

* cited by examiner

*Primary Examiner* — Pho M Luu
(74) *Attorney, Agent, or Firm* — CKC & Partners Co., Ltd.

(57) ABSTRACT

A memory device includes a memory array, a word line driver, and source drivers. The memory array includes memory units. The memory units arranged in the same column are coupled to corresponding bit line. The memory units arranged in the same row are coupled to corresponding word line. The memory units arranged in the rows are divided into N groups, in which N is an integer greater than or equal to 2. The word line driver is configured to selectively enable the word lines. Source drivers are coupled to the memory units in the groups respectively and configured to output N source control signals. When any word line in a first group is enabled, the source control signals corresponding to the first group and a second group of which the sequence for read-write operation is next to the first group are controlled at a select level by corresponding source drivers.

20 Claims, 6 Drawing Sheets

MEMORY DEVICE AND DRIVING METHOD THEREOF

RELATED APPLICATIONS

This application claims priority to Chinese Application Serial Number 201510266961.1 filed May 22, 2015, which is herein incorporated by reference.

BACKGROUND

1. Technical Field

The present disclosure relates to a memory device, and in particular, to a memory device configured so as to suppress the bit line leakage current.

2. Description of Related Art

Recently, the existing memory technology faces physical limits in scaling down, such that developing new memory technologies becomes important in the research of the related field.

As the structure of memory array increases in size, a memory device in the array structure is disturbed by the parasitic leakage current, which not only increases the power consumption but also may cause misread when the memory device reads data via the bit lines. Therefore, there is an urgent need to suppress the leakage current on the bit line in the memory device and at the same time to save the area of the memory device in the related field.

SUMMARY

To solve the problem stated above, one aspect of the present disclosure is a memory device. The memory device includes a memory array, a word line driver, and n source drivers. The memory array includes a plurality of memory units arranged in rows and at least one column. The memory units arranged in the same column are electrically coupled to a corresponding bit line. The memory units arranged in the same row are electrically coupled to a corresponding word line. The memory units arranged in the rows are divided into n groups, in which n is a positive integer greater than or equal to 2. The word line driver is configured to selectively enable the word lines. Source drivers are coupled to the memory units in the n groups respectively and configured to output n source control signals. When any word line in a first group of the n groups is enabled, the source control signals corresponding to the first group and a second group of which the sequence for read-write operation is next to the first group are controlled at a select level by the corresponding source drivers.

Another aspect of the present disclosure is a driving method for the memory device. The driving method includes: driving and enabling a given word line of the word lines; providing a source control signal having a select level to the memory unit group corresponding to the given word line; providing the source control signal having the select level to the next stage memory unit group; and providing the source control signal having a bias level to other memory unit groups.

Yet another aspect of the present disclosure is a memory device. The memory device includes a plurality of first memory units, a plurality of second memory units, a first source driver, and a second source driver. The first memory units are coupled to a plurality of first word lines respectively, and configured to perform a read-write operation according to a first source control signal. The second memory units are coupled to a plurality of second word lines respectively, and configured to perform the read-write operation according to a second source control signal. The first source driver is coupled to the first memory units, and configured to output the first source control signal. The second source driver is coupled to the second memory units, and configured to output the second source control signal. When any first word lines is enabled, the first source control signal outputted by the first source driver is controlled at a select level.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
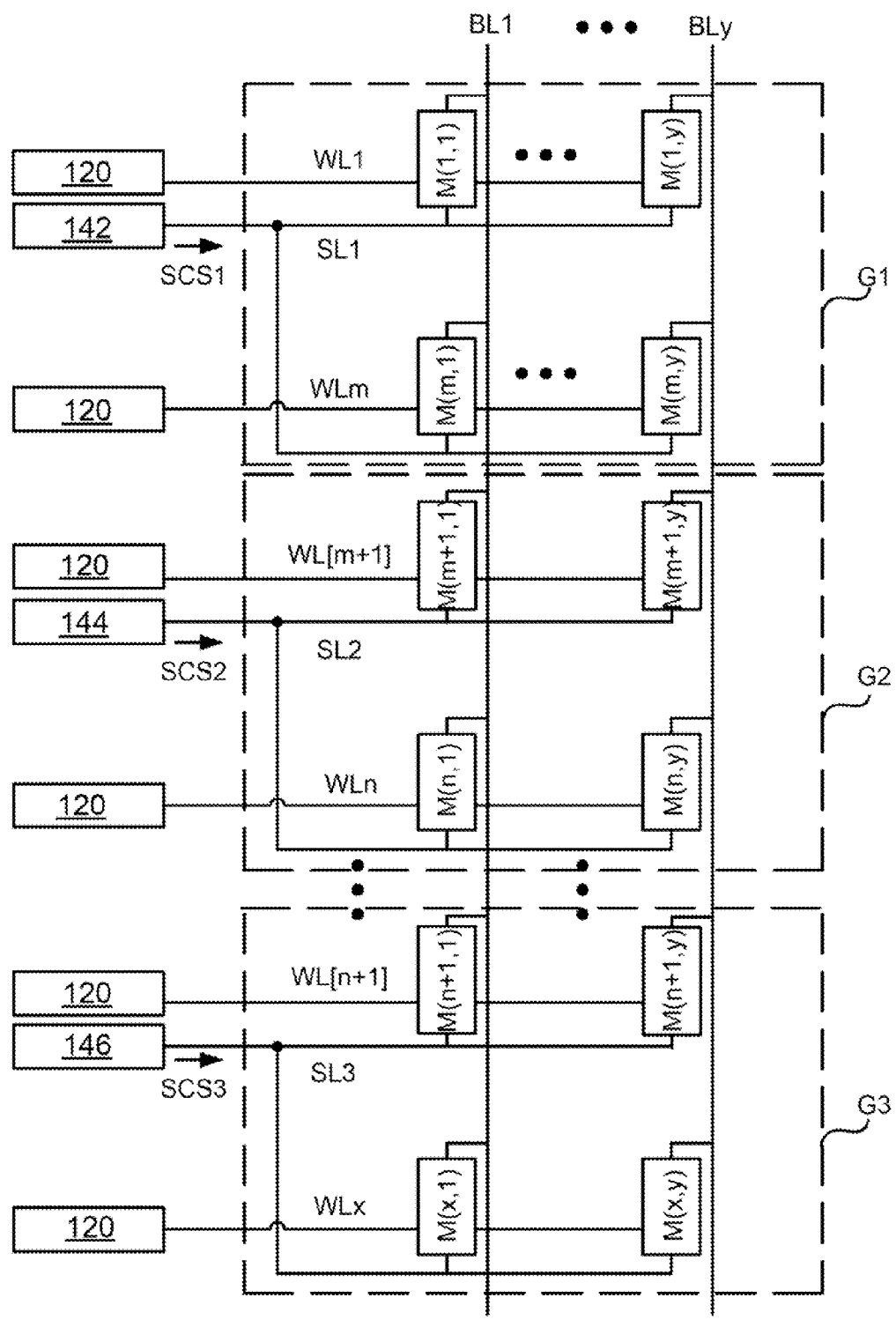
FIG. 1 is a diagram illustrating a memory device according to an embodiment of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

The terms "about" and "approximately" in the disclosure are used as equivalents. Any numerals used in this disclosure with or without "about," "approximately," etc. are meant to cover any normal fluctuations appreciated by one of ordinary skill in the relevant art. In certain embodiments, the term "approximately" or "about" refers to a range of values that fall within 20%, 10%, 5%, or less in either direction (greater or less than) of the stated reference value unless otherwise stated or otherwise evident from the context.

In the following description and in the claims, the terms "include" and "comprise" are used in an open-ended fashion, and thus should be interpreted to mean "include, but not limited to." As used herein, the term "and/or" includes any and all combinations of one or more of the associated listed items.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

A memory device is disclosed in the present disclosure, which can effectively suppresses the leakage current on the memory bit lines to solve the issue of data misreading due to the bit line leakage current occurred in the known memory.

Reference is made to FIG. 1. FIG. 1 is a diagram illustrating a memory device according to an embodiment of the present disclosure. As shown in FIG. 1, the memory device includes word lines WL1~WLx, bit lines BL1~Bly, source lines SL1~SL3 and a memory array formed by multiple memory units M(1,1)~M(x,y), in which each memory unit M(1,1)~M(x,y) is coupled to corresponding one of the word lines WL1~WLx and corresponding one of the bit lines BL1~Bly. Specifically, the memory units M(1,1)~M(x,y) arranged in the same column are electrically coupled to the same corresponding bit lines BL1~Bly, and the memory units M(1,1)~M(x,y) arranged in the same row are electrically coupled to the same corresponding word lines WL1~Wlx.

For example, as shown in FIG. 1, each of the memory units includes a control terminal, a bit terminal, and a bias terminal. The control terminals of the memory units arranged in the same row are commonly electrically coupled to the corresponding word lines WL1~WLx. The bit terminal of the memory unit arranged in the same column are commonly electrically coupled to the corresponding bit lines BL1~BLy. The bias terminals of the memory units in the same group are configured to commonly receive the source control signals SCS1~SCS3 corresponding to the group.

In addition, the memory device 100 includes a word line driver 120 and multiple stages of source drivers 142, 144 and 146. The word line driver 120 is configured to selectively enable the word lines WL1~WLx. The source drivers 142, 144 and 146 are coupled to source lines SL1, SL2, and SL3 respectively and configured to output the source control signals SCS1~SCS3.

In the present embodiment, the memory units M(1,1)~M(x,y) arranged in rows are divided to n groups, in which n is a positive integer greater than or equal to 2. For example, memory units M(1,1)~M(x,y) may be divided to multiple stages of memory unit groups G1~G3. The memory unit groups G1~G3 are connected in series to the bit lines BL1~BLy. The memory unit group G1 includes the memory units M(1,1)~M(m,y) coupled to any one of the first to the m-th word lines (i.e., WL1~WLm), in which m is a positive integer greater than 1. Similarly, the memory unit group G2 includes the memory units M(m+1,1~M(n,y) coupled to any one of the (m+1)th to the n-th word lines (i.e., WL[m+1]~WLn), in which n is a positive integer greater than m. The memory unit group G3 includes the memory units M(n+1,1)~M(x,y) coupled to any one of the (n+1)th to the x-th word lines (i.e., WL[n+1]~WLx).

It is noted that the number of the memory unit groups, the number of the word lines corresponding to each of the memory unit groups, and the number of the memory units may be adjusted according to the practical needs. The embodiment shown in FIG. 1 is just by example and not meant to limit the present disclosure.

In the present embodiment, the source terminals of the memory units M(1,1)~M(m,y) in the memory unit group G1 are coupled to each other and coupled to the corresponding source line SL1, and configured to execute read/write operation according to the corresponding source control signal SCS1.

Similarly, the source terminals of the memory units in the memory unit group G1 and G3 are respectively coupled to the corresponding source lines SL2 and SL3, and configured to execute read/write operation according to the corresponding source control signals SCS2 and SCS3. Alternatively stated, the source drivers 142, 144, and 146 are respectively coupled to memory units in n groups (i.e., the memory unit groups G1, G2, and G3), and configured to output n source control signal SCS1, SCS2, and SCS3.

Figure 2A:
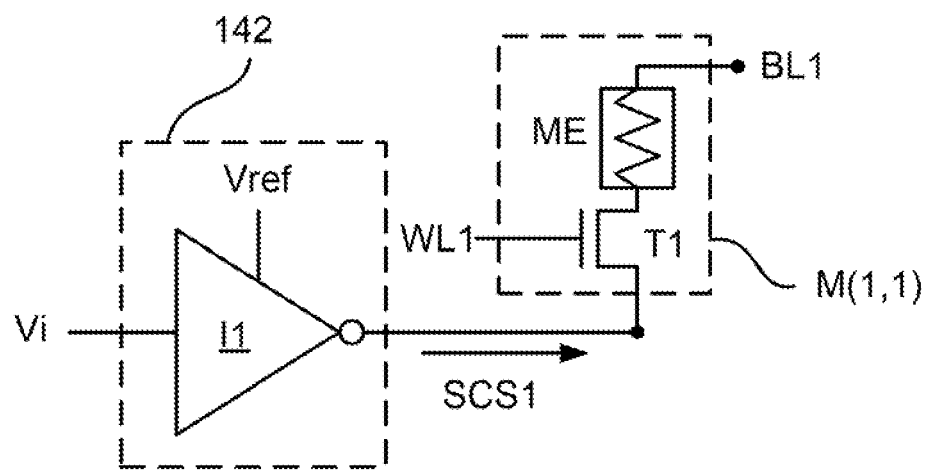
FIG. 2A-2D are diagrams illustrating a memory unit and a source driver according to an embodiment of the present disclosure.

The source drivers 142~146 may be implemented by various circuits. In the following paragraph, the source driver 142 will be taken as an example for the explanation. FIG. 2A is a diagram illustrating the memory unit M(1,1) and the source driver 142 according to an embodiment of the present disclosure. As shown in FIG. 2A, the memory unit M(1,1) may include a transistor T1 and a memory element ME. A gate terminal of the transistor T1 is electrically coupled to the control terminal of the memory unit, and a source terminal of the transistor T1 is electrically coupled to the bias terminal of the memory unit. A first terminal of the memory element ME is electrically coupled to the bit terminal of the memory unit, and a second terminal of the memory element ME is electrically coupled to a drain terminal of the transistor T1.

In one example, the memory unit M(1,1) may be a memristor memory unit and the memory element ME may be a memristor memory element. The first terminal of the memory element ME is electrically coupled to the bit line BL1 and the resistance of the memory element ME may be configured to switch between a high resistance value and a low resistance value to store the information by the change of the resistance value. The first terminal of the transistor T1 is coupled to the second terminal of the memory element ME, and the second terminal of the transistor may be configured to receive the corresponding source control signal SCS1, and the control terminal of the transistor T1 is coupled to the corresponding one of the word lines WL1~WLx (e.g., word line WL1).

It is noted that the memory unit M(1,1) may be implemented by various memory units such as magnetic memory units, resistive memory units, or capacitive memory units. The above-mentioned embodiments using memristor memory units are only by example and not meant to limit the present disclosure.

The source driver 142 may include an inverter I1. The power terminal of the inverter I1 is configured to receive a reference voltage Vref, the input terminal is configured to receive an input signal Vi, and the output terminal is coupled to the source terminals of the memory units M(1,1)~M(m,y) via the source line SL1. The inverter I1 is configured to selectively output the source control signal SCS1 according to the input signal Vi such that the source control signal SCS1 has a bias level Vbias or a select level Vselect. For example, in some embodiment, the select level Vselect may be substantially zero. When the input signal Vi has a high level, the inverter I1 is configured to output the source control signal SCS1 having the select level Vselect (i.e., low level). On the other hand, when the input signal Vi has a low level, the inverter I1 is configured to output the source control signal SCS1 having the bias level Vbias (i.e., high level).

Figure 2B:
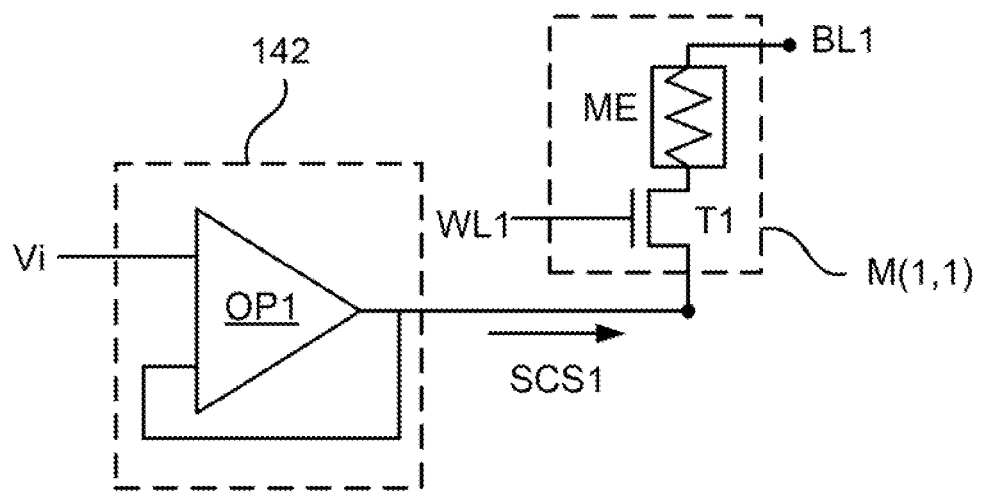

FIG. 2B is a diagram illustrating the memory unit M(1,1) and the source driver 142 according to another embodiment of the present disclosure. As shown in the FIG. 2B, the source driver may also be implemented by an operational amplifier circuit. In the present example, the source driver 142 includes operational amplifier OP1. The operational amplifier OP1 is connected in a negative feedback configuration. The first input terminal is configured to receive the input signal Vi, and the second terminal is coupled to the output terminal. Thus, the operational amplifier OP1 works as a voltage follower such that the source control signal SCS1 outputted by the output terminal has a same voltage level to the input signal Vi, so as to selectively output the source control signal SCS1 having the bias level Vbias or the select level Vselect. For example, when the input signal Vi has a low level, the operational amplifier OP1 is configured to output the source control signal SCS1 having the select level Vselect (i.e., low level). On the other hand, when the input signal Vi has a high level, the operational amplifier OP1 is configured to output the source control signal SCS1 having the bias level Vbias (i.e., high level).

Figure 2C:
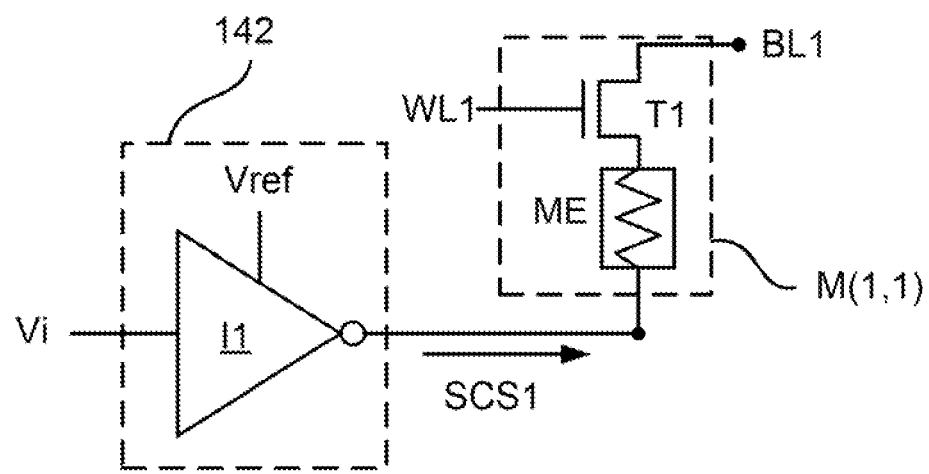
Figure 2D:
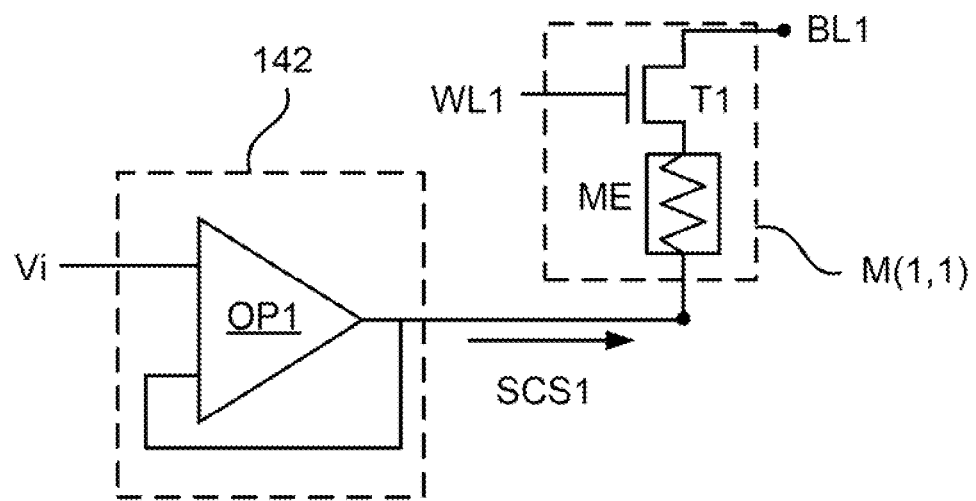

In addition, the upper and the lower placement of the transistor T1 and the memory element ME may also be changed alternatively. Reference is made to FIGS. 2C and 2D. FIGS. 2C and 2D are diagrams illustrating the memory unit M(1,1) and the source driver 142 according to another embodiment of the present disclosure. As shown in the FIGS. 2C and 2D, in one embodiment, the drain terminal of the transistor T1 is electrically coupled to the bit terminal of the memory unit. The first terminal of the memory element is electrically coupled to the source terminal of the transistor T1, and the second terminal of the memory element is electrically coupled to the bias terminal. The specific operating method is similar to the embodiments shown in FIGS. 2A and 2B and is omitted here for the sake of the brevity.

Figure 3:
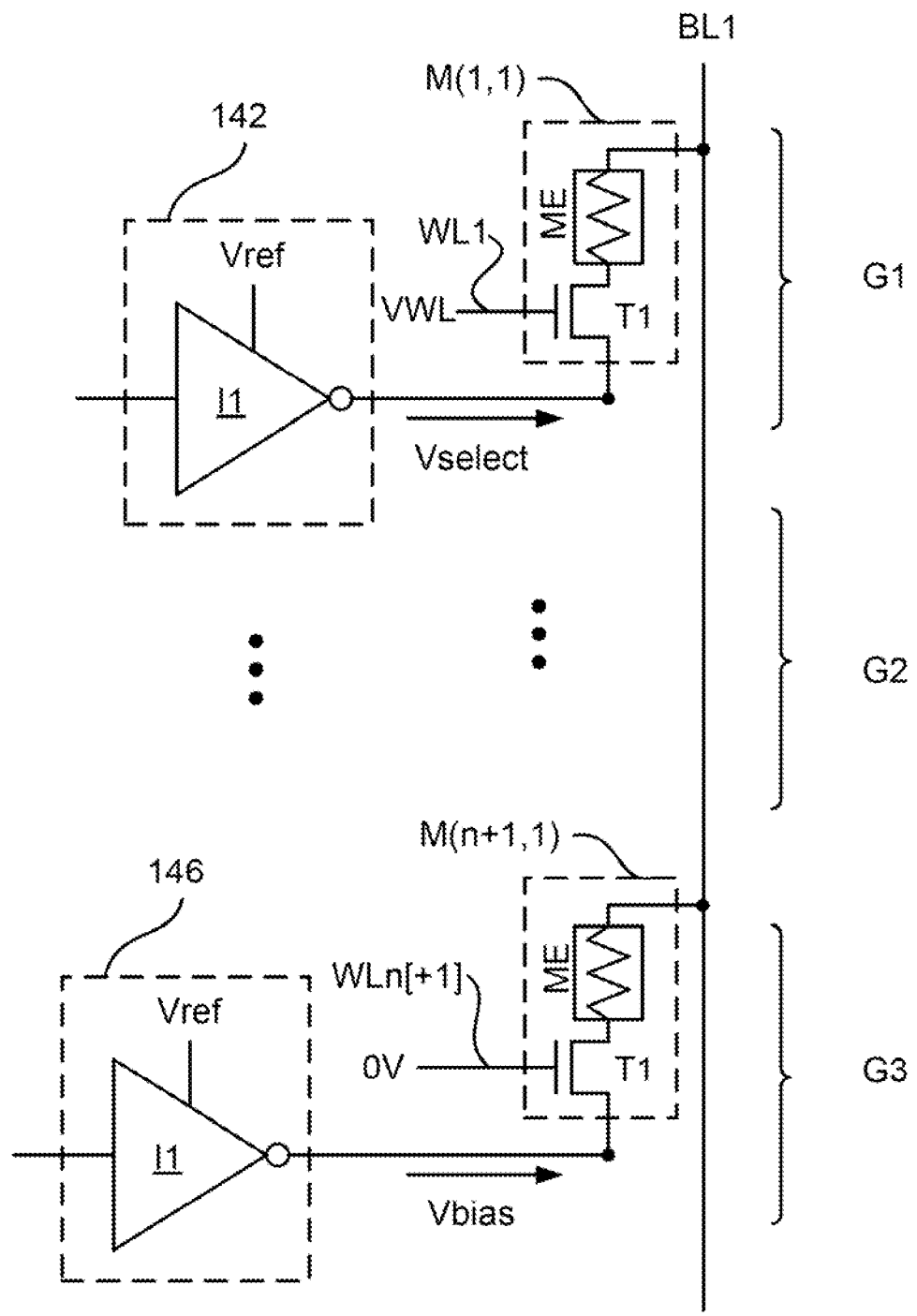
FIG. 3 is a diagram illustrating the operation of the memory device according to an embodiment of the present disclosure.

FIG. 3 is a diagram illustrating the operation of the memory device 100 according to an embodiment of the present disclosure. As shown in FIG. 3, when any word line (e.g., word line WL1) corresponding to the memory units in the memory unit group G1 is enabled (e.g., the word line is at a high level VWL), the source control signal SCS1 corresponding to the memory unit group G1 has the select level Vselect. For other memory unit groups (e.g., the memory unit group G3) of which all the corresponding word lines are not enabled (e.g., the word lines are at substantially zero voltage 0V), the corresponding source control signal SCS3 has the bias level Vbias (e.g., high level). In one embodiment, the level of the bias level Vbias may be the working voltage of the memory unit, or the voltage of the bit line BL1 so as to suppress the leakage current of the off-state transistor T1.

Thus, the voltage level of the source terminal of the selected memory unit M(1,1)~M(1,Y) is pulled down to the select level Vselect (e.g., substantially zero), and the corresponding transistor T1 is configured to be on to execute the read/write operation normally. When the word line driver 120 sequentially enables the next word line WL2 to read or write the memory units M(2,1)~M(2,Y), due to the fact that the voltage level of the source terminal of the memory units in the memory group G1 are all at the select level Vselect, no extra time is needed to switch the voltage level of the source terminal of the memory units M(2,1)~M(2,Y) to turn on the corresponding transistor T1, and therefore the driving time is saved. On the other hand, the voltage level of source terminal of the transistor T1 for memory units in the memory units group G2 and G3 is controlled at the bias level Vbias (e.g., high level), the leakage current occurred between the drain terminal and the source terminal of the transistor T1 is lowered.

Thus, by grouping the memory units, the memory device 100 may output the same source control signal on the same source line to control memory units on multiple word lines. That saves the number of the drivers, decreases the area of the driving circuit, and suppresses the leakage current on the bit lines by the control of the source control signal.

Figure 4:
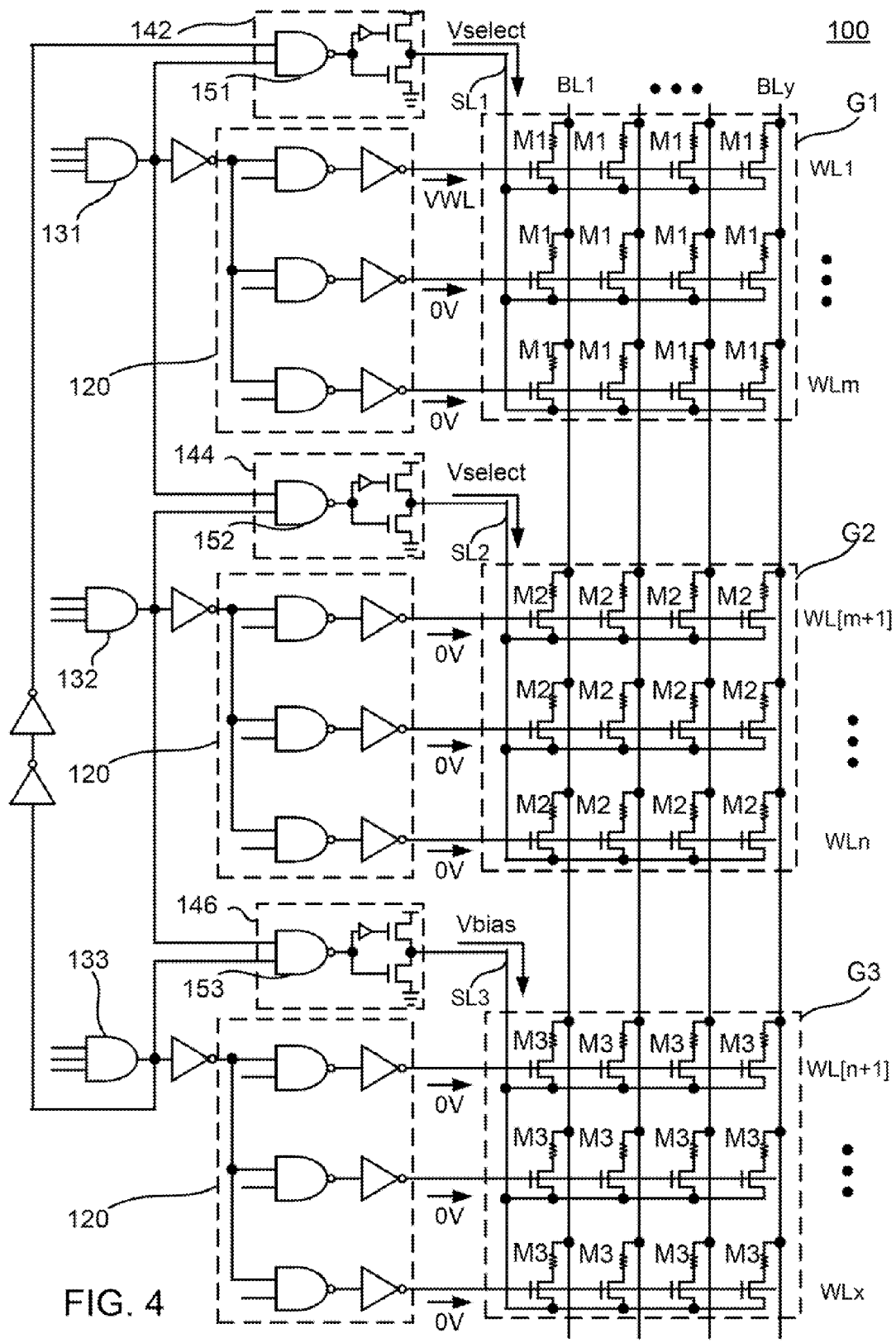
FIG. 4 is a diagram illustrating the memory device according to another embodiment of the present disclosure.

In some embodiments, the memory device 100 may support continuous read functionality. Reference is made to FIG. 4. FIG. 4 is a diagram illustrating the memory device 100 according to another embodiment of the present disclosure. For the embodiment shown in FIG. 4, the memory unit M1 of the memory unit group G1, the memory unit M2 of the memory unit group G2, and the memory unit M3 of the memory unit group G3 are coupled to word lines WL1~WLm, WL[m+1]~WLn, and WL[n+1]~WLx, respectively, and configured to execute read or write operations according to the source control signals SCS1, SCS2, and SCS2 respectively. The word line driver 120 is configured to sequentially enable word lines WL1~WLm corresponding to the memory unit group G1, word lines WL[m+1]~WLn corresponding to the memory unit group G2, and word lines WL[n+1]~WLx corresponding to the memory unit group G3.

In the present embodiment, when any word line (e.g., word line WL1) corresponding to the memory units in the memory unit group G1 is enabled (e.g., the word line is at a high level VWL), not only the source control signal SCS1 corresponding to the memory unit group G1 has the select level Vselect, but the source control signal SCS2 corresponding to the next stage memory unit group G2 has the select level Vselect. Alternatively stated, when any word line in a first group (e.g., memory unit group G1) of the n group is enabled, the source control signals corresponding to the first group and a second group (e.g., memory unit group G2), which is next to the first group for read-write operation, are controlled at the select level Vselect by the corresponding source drivers. Thus, when the word line driver 120 sequentially enables word lines WL1~WLx, and switches from enabling the word line WLm corresponding to the memory unit group G1 to enabling the word line WL[m+1] corresponding to the memory unit group G2, the voltage level of the source terminal for the memory units M2 in the memory unit group G2 are controlled at the select level Vselect, so the memory units M2 may directly execute the read or write operation without waiting for the switching of the voltage level of the source terminal, thus the continuous read functionality is achieved.

Alternatively stated, when any one of the word lines WL1~WLm is enabled, the source control signals SCS1 and SCS2 have the select level Vselect, and the source control signals SCS3 has the bias level Vbias, which is different from the select level Vselect. That is, the source control signal SCS3, which corresponds to groups other than the first group (e.g., the memory unit group G1) and the second group (e.g., the memory unit group G2), is controlled at the bias level Vbias by the source driver 146. At this time the word lines WL[m+1]~WLn corresponding to the memory unit group G2 are not enabled, and the voltage level of the source terminal for the memory unit M3 corresponding to the next stage memory unit group G3 has the bias level Vbias so as to turn off the corresponding transistors T1 to lower the leakage current on bit lines BL1~BLy. It is noted that the bias level Vbias is different from the select level Vselect, and the select level Vselect is configured so as to process the read-write operation of the memory units, and the bias level Vbias is configured to suppress the leakage current of the memory units not in the operating state.

Similarly, when any one of the word line WL[m+1]~WLn is enabled, the source control signals, SCS2 and SCS3, have the select level Vselect, and the source control signal SCS1 has the bias level Vbias, which is different from the select level Vselect. At the time the word lines WL[n+1]~WLx corresponding to the memory unit group G3 are not enabled, and the voltage level of the source terminal for the memory unit M1 corresponding to the next stage memory unit group G1 has the bias level Vbias so as to turn off the corresponding transistors T1 to lower the leakage current on bit lines BL1~BLy.

Thus, the memory device may suppress the leakage current on the bit lines BL1~BLy by controlling the voltage levels of the source control signals SCS1, SCS2, and SCS3, so that the memory units M1, M2, and M3 coupled to the word lines WL~WLx respectively can execute the read or write operations sequentially without waiting for the switching of the source terminal voltage level in order to achieve the continuous read functionality.

It is noted that though the embodiment shown in FIG. 4 takes a 3 memory unit groups as the example, the memory device may include N memory unit groups, in which N is an integer greater than 2. When the word line corresponding to the Xth memory group is enabled, the source lines of the X and the X+1 memory groups are configured to output the source control signal having the select level Vselect to achieve the continuous read functionality. The source lines of the other memory groups are configured to output the source control signal having the bias level Vbias to lower the leakage current on the bit lines BL1~BLy.

In the embodiment shown in FIG. 4, each of the source drivers 142, 144, and 146 includes a logic circuit and an output circuit. The logic circuit is configured to control the output circuit to selectively output the source control signals SC1, SCS2 and SCS3 having the bias level Vbias or the select level Vselect. In accordance with the source drivers shown in FIG. 2A-2D, the output circuit of each of the source drivers 142, 144, and 146 includes an inverter or an operational amplifier.

In addition, in the embodiment shown in FIG. 4, the memory device 100 further includes a group control circuit configured to control the logic circuits of the source drivers 142, 144 and 146 so that the output circuits control the bias terminal of the memory units in the first group and the second group at the select level Vselect, and the output circuits control the bias terminal of the memory units in the group other than the first group and the second group at the bias level Vbias. The specific operation of the group control circuit will be explained in the following paragraphs.

The continuous read mode of the memory driving circuit in an embodiment of the present disclosure to lower the leakage current will be explained in accordance with the FIG. 4. When reading the memory unit group G1, the logic gates 132, 133 are configured to output a logic 1, and the logic gate 131 is configured to output a logic 0, at this time, the logic gates 151, 152 are configured to output the logic 1, and the logic gate 153 is configured to output the logic 0, thus the select level Vselect (e.g., ground voltage GND in the present embodiment) is configured to output to the source terminals of the memory unit groups G1 and G2, and the bias level Vbias is configured to output to the source terminals of the memory unit group G3. Therefore, the memory unit groups G1 and G2 may be configured to read the data continuously, and source terminals of the memory unit groups (e.g., memory unit group G3) other than G1 and G2 may be pulled to bias level Vbias and thus the leakage current of the memory units is suppressed.

When data reading in the memory unit group G1 is finished and the memory units in the memory unit group G2 are about to be read, the logic gate 131 is controlled to output the logic 1, the logic gate 132 is controlled to output the logic 0, and the logic gate 133 is controlled to keep the output to be the logic 1. At this time, the logic gates 152, 153 are configured to output the logic 1 while the logic gate 151 is configured to output the logic 0, thus the select level Vselect (e.g., ground voltage GND in the present embodiment) is configured to output to the source terminals of the memory unit group G2 and G3, and the bias level Vbias is configured to output to the source terminals of the memory unit group G1. Therefore, the memory unit groups G2 and G3 may be configured to read the data continuously, and source terminals of the memory unit groups (e.g., memory unit group G1) other than G2 and G3 may be pulled to bias level Vbias and thus the leakage current of the memory units in the memory unit groups other than G2 and G3 is suppressed. By keeping the voltage level at the source terminals of the two adjacent memory unit groups to be the select level Vselect and the voltage level at the source terminals of the others memory unit groups to be the bias level Vbias, the leakage current of the large capacity memory can be lowered significantly.

Figure 5:
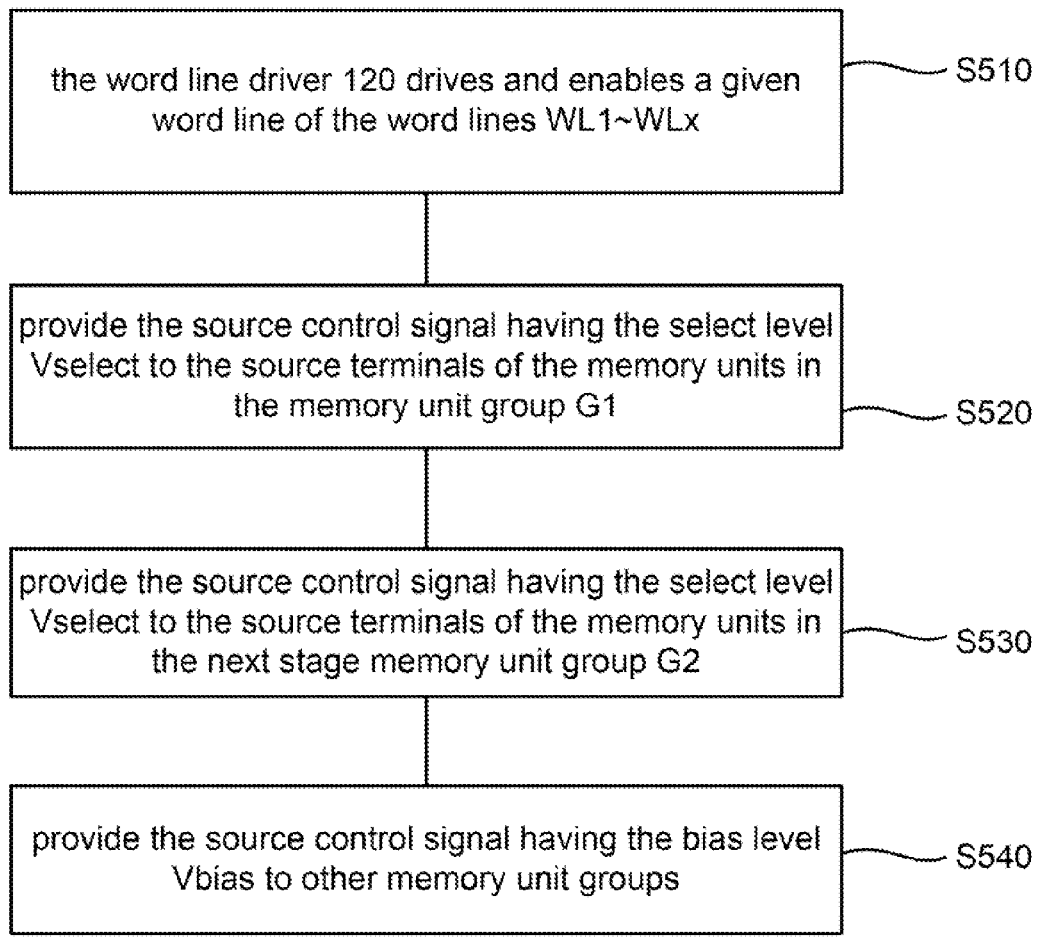
FIG. 5 is a flowchart illustrating a memory device driving method according to an embodiment of the present disclosure.

FIG. 5 is a flowchart illustrating the memory device driving method 500 according to an embodiment of the present disclosure. The memory device driving method includes steps S510, S520, S530 and S540, which will be explained in specific as following. For better understanding of the present disclosure, the following memory device driving method 500 is discussed in relation to the memory device 100 shown in FIG. 4, but is not limited thereto. First, in the step S510, the word line driver 120 drives and enables a given word line (e.g., WL1) of the word lines WL1~WLx. Next, in the step S520 and S530, when the memory unit group G1 corresponding to the given word line WL1 is read, the source drivers 142 and 144 provide the source control signal SCS1 and SCS2 having the select level Vselect to the source terminals of the memory units in the memory unit group G1 and the next memory unit group G2. Next, in the step S540, the other source drivers (e.g., the source driver 146) provide the source control signal having the bias level Vbias to other memory unit groups. It is noted that, when the memory unit group G2 is read, the source drivers 144 and 146 provide the source control signals SCS2 and SCS3 having the select level Vselect to the memory unit groups G2 and G3, and the other source drivers (e.g., the source driver 142) provide the source control signal having the bias level Vbias to other memory unit groups, and so on, all the memory units can be read continuously as the leakage current is kept at the lowest.

The above description includes exemplary operations, but the operations are not necessarily performed in the order described. The order of the operations disclosed in the present disclosure may be changed, or the operations may even be executed simultaneously or partially simultaneously as appropriate, in accordance with the spirit and scope of various embodiments of the present disclosure.

Although the disclosure has been described in considerable detail with reference to certain embodiments thereof, it will be understood that the embodiments are not intended to limit the disclosure. It will be apparent to those skilled in the art that various modifications and variations can be made to the structure of the present disclosure without departing from the scope or spirit of the disclosure. For example, the number of memory unit groups or the number of the word lines corresponding to each memory unit group may be changed. In view of the foregoing, it is intended that the present disclosure cover modifications and variations of this disclosure provided they fall within the scope of the following claims.

What is claimed is:

1. A memory device, comprising:
   a memory array, comprising a plurality of memory units arranged in a plurality of rows and at least one column, wherein the memory units arranged in the same column are electrically coupled to a corresponding bit line, the memory units arranged in the same row are electrically coupled to a corresponding word line, and the memory units arranged in the rows are divided into n groups, wherein n is a positive integer greater than or equal to 2;
   a word line driver configured to selectively enable the word lines; and
   n source drivers coupled to the memory units in the n groups respectively, configured to output n source control signals,
   wherein, when any word line in a first group of the n groups is enabled, the source control signals corresponding to the first group and a second group of which the sequence for read-write operation is next to the first group are controlled at a select level by the corresponding source drivers.

2. The memory device of claim 1, wherein the source control signals corresponding to the groups other than the first group and the second group are controlled at a bias level by the corresponding source drivers.

3. The memory device of claim 2, wherein the bias level is different from the select level; and the select level is configured so as to process the read-write operation of the memory units, and the bias level is configured to suppress a leakage current of the memory units not in an operating state.

4. The memory device of claim 3, wherein each of the memory unit comprises:
   a control terminal, wherein the control terminals of the memory units arranged in the same row are commonly electrically coupled to the corresponding word line;
   a bit terminal, wherein the bit terminals of the memory units arranged in the same column are commonly electrically coupled to the corresponding bit line; and
   a bias terminal, wherein the bias terminal of the memory units in the same group are configured to commonly receive the source control signal corresponding the group.

5. The memory device of claim 4, wherein each of the source drivers comprises a logic circuit and an output circuit, wherein the logic circuit is configured to control the output circuit to selectively output the source control signal having the bias level or the select level.

6. The memory device of claim 5, wherein the output circuit comprises an inverter or an operational amplifier.

7. The memory device of claim 5, further comprising:
   a group control circuit configured to control the logic circuits of the source drivers such that the output circuits controls the bias terminal of the memory units in the first group and the second group at the select level, and the output circuits controls the bias terminal of the memory units in the group other than the first group and the second group at the bias level.

8. The memory device of claim 4, wherein each of the memory unit further comprises:
   a transistor, wherein a gate terminal of the transistor is electrically coupled to the control terminal of the memory unit, and a source terminal of the transistor is electrically coupled to the bias terminal of the memory unit; and
   a memory element, wherein a first terminal of the memory element is electrically coupled to the bit terminal of the memory unit, and a second terminal of the memory element is electrically coupled to a drain terminal of the transistor.

9. The memory device of claim 4, wherein each of the memory unit further comprises:
   a transistor, wherein a gate terminal of the transistor is electrically coupled to the control terminal of the memory unit, and a drain terminal of the transistor is electrically coupled to the bit terminal of the memory unit; and
   a memory element, wherein a first terminal of the memory element is electrically coupled to a source terminal of the transistor, and a second terminal of the memory element is electrically coupled to the bias terminal of the memory unit.

10. A driving method for a memory device, wherein the memory device comprises a plurality of source lines and a plurality of memory unit groups corresponding to the source lines, and each of the memory unit groups comprises a plurality of memory units coupled to a plurality of word lines respectively and to the corresponding source line, and the driving method comprises:
    driving and enabling a given word line of the word lines;
    providing a source control signal having a select level to the memory unit group corresponding to the given word line;
    providing the source control signal having the select level to the next stage memory unit group; and
    providing the source control signal having a bias level to other memory unit groups.

11. The driving method of claim 10, wherein driving and enabling the given word line of the word lines comprises providing a high voltage level to the given word line.

12. The driving method of claim 10, wherein the select level is lower than the bias level.

13. The driving method of claim 10, wherein the select level is substantially zero voltage.

14. The driving method of claim 10, wherein the bias level is a working voltage of the memory unit or the voltage of the corresponding bit line.

15. The driving method of claim 10, further comprising:
    enabling the word lines corresponding to the each memory unit group sequentially.

16. A memory device, comprising:
    a plurality of first memory units coupled to a plurality of first word lines respectively, and configured to perform a read-write operation according to a first source control signal;
    a plurality of second memory units coupled to a plurality of second word lines respectively, and configured to perform the read-write operation according to a second source control signal;
    a first source driver coupled to the first memory units, and configured to output the first source control signal; and
    a second source driver coupled to the second memory units, and configured to output the second source control signal,
    wherein, when any one of the first word lines is enabled, the first source control signal outputted by the first source driver is controlled at a select level.

17. The memory device of claim 16, further comprising:
a plurality of third memory units coupled to a plurality of third word lines respectively, and configured to perform the read-write operation according to a third source control signal; and
a third source driver coupled to the third memory units, and configured to output the third source control signal,
wherein, when any one of the first word lines is enabled, the second source control signal outputted by the second source driver is controlled at the select level, and the third source control signal outputted by the third source driver is controlled at a bias level.

18. The memory device of claim 17, wherein the bias level is different from the select level, and the select level is configured so as to process the read-write operation of the first memory units, the second memory units, or the third memory units; and
the bias level is configured so as to suppress a leakage current of the first memory units, the second memory units, or the third memory units not in an operating state.

19. The memory device of claim 17, wherein the bias level is a working voltage of the first memory units, the second memory units, and the third memory units.

20. The memory device of claim 16, further comprising:
a word line driver configured to selectively enable a given word line from the first word lines, the second word lines, and the third word lines.

\* \* \* \* \*